United States Patent
Yamasaki et al.

(10) Patent No.: US 6,797,068 B1
(45) Date of Patent: Sep. 28, 2004

(54) FILM FORMING UNIT

(75) Inventors: Hideaki Yamasaki, Nirasaki (JP); Takashi Mochizuki, Nirasaki (JP); Susumu Arima, Nirasaki (JP); Yumiko Kawano, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 83 days.

(21) Appl. No.: 10/049,283

(22) PCT Filed: Aug. 11, 2000

(86) PCT No.: PCT/JP00/05409
§ 371 (c)(1),
(2), (4) Date: Feb. 11, 2002

(87) PCT Pub. No.: WO01/12875
PCT Pub. Date: Feb. 22, 2001

(30) Foreign Application Priority Data

Aug. 11, 1999 (JP) .......................................... 11/228047

(51) Int. Cl.[7] .............................................. C23C 16/00
(52) U.S. Cl. .................. 118/728; 118/725; 156/345.51; 156/345.52
(58) Field of Search ................................ 118/728, 725, 118/724; 156/345.51, 345.52

(56) References Cited

U.S. PATENT DOCUMENTS

| | | | |
|---|---|---|---|
| 4,789,648 A | 12/1988 | Chow et al. | |
| 5,494,494 A | * 2/1996 | Mizuno et al. | 438/680 |
| 5,711,815 A | 1/1998 | Lee et al. | 118/725 |
| 5,851,299 A | * 12/1998 | Cheng et al. | 118/729 |
| 5,997,651 A | * 12/1999 | Matsuse et al. | 118/725 |

FOREIGN PATENT DOCUMENTS

| | | |
|---|---|---|
| JP | 6-177217 | 6/1994 |
| JP | 6-208959 | 7/1994 |
| JP | 7-221024 | 8/1995 |
| JP | 9-186095 | 7/1997 |
| JP | 9-260469 | 10/1997 |
| JP | 9-316644 | 12/1997 |
| JP | 2886878 | 2/1999 |

OTHER PUBLICATIONS

International Search Report of PCT/JP00/05409 (PCT/ISA/210).

Copy of PCT/IB/306.

PCT Notification of Transmittal of Copies of Translation of the International Preliminary Examination Report (PCT/IB/338) issued for PCT/JP00/05409.

International Preliminary Examination Report (PCT/IPEA/409) (translated) issued for PCT/JP00/05409.

* cited by examiner

*Primary Examiner*—Parviz Hassanzadeh
(74) *Attorney, Agent, or Firm*—Smith, Gambrell & Russell, LLP (57) ABSTRACT

A film-forming unit of the invention includes a processing container in which a vacuum can be created, a stage arranged in the processing container, on which an object to be processed is placed, a process-gas supplying means for supplying a process gas into the processing container, and a heating means for heating the object to be processed placed on the stage. A division wall surrounds a lateral side and a lower side of the stage. An inert gas is introduced into a stage-side region surrounded by the division wall, by an inert-gas supplying means. A gap-forming member is arranged in such a manner that its inner peripheral portion is arranged above a peripheral portion of the object to be processed placed on the stage via a gap and its outer peripheral portion is arranged above the division wall via a gap.

12 Claims, 6 Drawing Sheets

|  | WIDTH | FLOW CHANNEL LENGTH | FLOW AMOUNT | FLOW SPEED | FLOW CHANNEL LENGTH × FLOW SPEED |
|---|---|---|---|---|---|
| FIRST GAS PURGING GAP | H1 | L1 | Q1 | v1 | L1×v1 |
| SECOND GAS PURGING GAP | H2 | L2 | Q2 | v2 | L2×v2 |
| FIRST GAS PURGING GAP | 0.05 | 2.8 | 40 | 13 | 0.036 |
| SECOND GAS PURGING GAP | 0.5 | 10 | 960 | 26 | 0.26 |
| UNIT | mm | mm | sccm | m/s | m²/s |

FILM FORMING UNIT

FIELD OF THE INVENTION

This invention relates to a film forming unit that can form a metallic film or a metallic compound film by means of a low-pressure vapor-phase chemical reaction, for example that can deposit a metal for a circuit by means of a chemical vapor deposition process.

BACKGROUND OF THE INVENTION

As a semiconductor device being an integrated circuit such as an IC is made more minute, a contact-hole for connecting different metallic-circuit layers to each other is also made more minute. That is, an aspect ratio (a ratio of a depth of the hole with respect to an open width) of the contact-hole is increased. In addition, there is known a method in which narrow grooves corresponding to a metallic-circuit pattern are formed in a surface of an insulating film in advance and then circuit elements are formed in the grooves (U.S. Pat. No. 4,789,648). In such a case, it is preferable that a metal for a circuit for forming the circuit element has a good coating characteristic and is deposited by a chemical vapor deposition method (CVD method) which is superior in an ability to fill a narrow groove.

Figure 7:
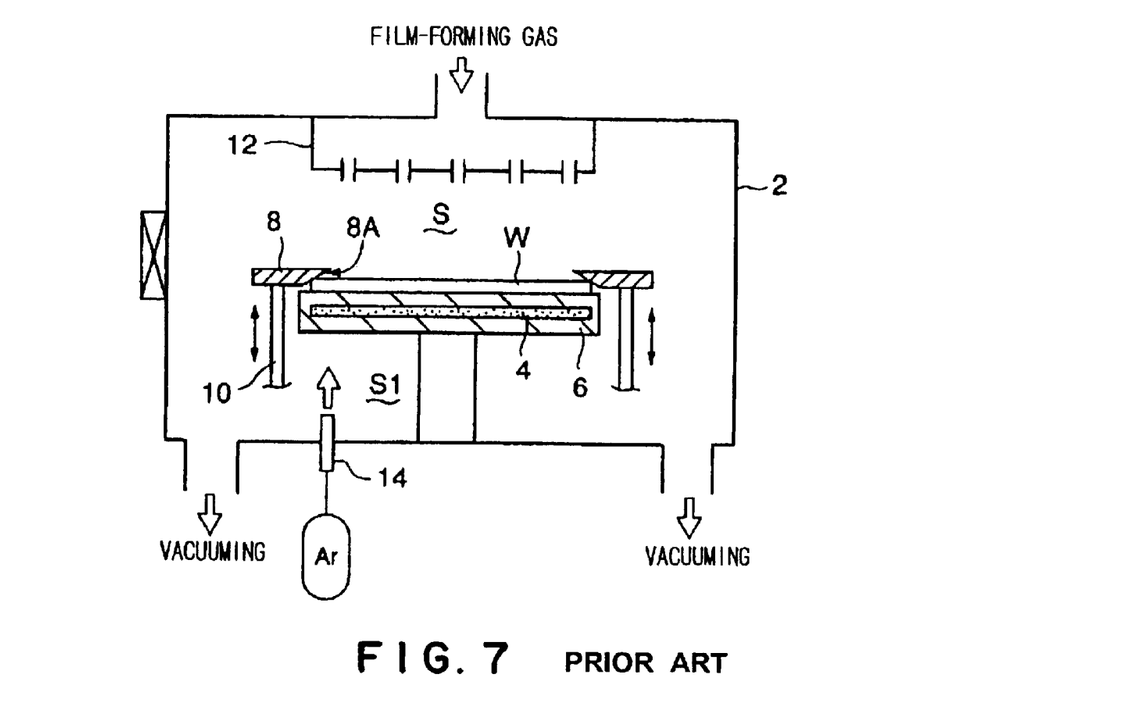
FIG. 7 is a schematic structural view showing an example of a conventional film-forming unit.

The metallic film or the metallic compound film that is deposited by the CVD method may be W (tungsten), WSi, TiN, Ti, Al, Cu and so on. Herein, a film forming unit for W is explained as an example of a conventional film forming unit. FIG. 7 shows a schematic view of the film forming unit. The film forming unit has a processing container 2 which has a substantially cylindrical shape and in which a vacuum can be created. A stage 6 in which a heater 4 is buried is arranged in the processing container 2. A semiconductor wafer W as an object to be processed is adapted to be placed on the stage 6.

A circular clamping ring 8, which is connected to a pushing rod 10, is arranged around the stage 6 in a vertical movable manner. The inner side of the clamping ring 8 forms a taper (inclined) surface 8A that tapers upward. The taper surface 8A is adapted to come in contact with a circumferencial edge of the wafer W and to push down the same. Thus, the wafer W is adapted to be fixed on the stage 6.

A ceiling part opposite to the stage 6 has a showerhead 12 for supplying a process gas such as a film-forming gas into a processing space S in the processing container 2.

An inert-gas supplying nozzle 14 that introduces an inert gas such as Ar gas into a reverse-side space S1 of the stage 6 is provided below the stage 6, in order to prevent that the film-forming gas reaches a reverse side of the wafer W or a reverse side of the stage 6 and that any unnecessary film is deposited during the film-forming process.

During the film-forming process, the wafer W is maintained at a predetermined process temperature, and the film-forming gas is introduced from the showerhead 12 into the processing container 2. Then, the processing container 2 is evacuated to maintain a predetermined process pressure, so that a tungsten film or the like is deposited. At that time, an inert gas such as Ar gas is supplied from the inert-gas supplying nozzle 14 into the reverse-side space S1 on a reverse side of the stage 6. This prevents the film-forming gas from flowing into the reverse-side space S1 through a gap between the clamping ring 8 and the wafer. If an unnecessary film is deposited on a lateral or reverse surface of the wafer W, the unnecessary film may be pealed off to become particles during a subsequent process. In the case, the generation of particles is prevented.

Figure 8:
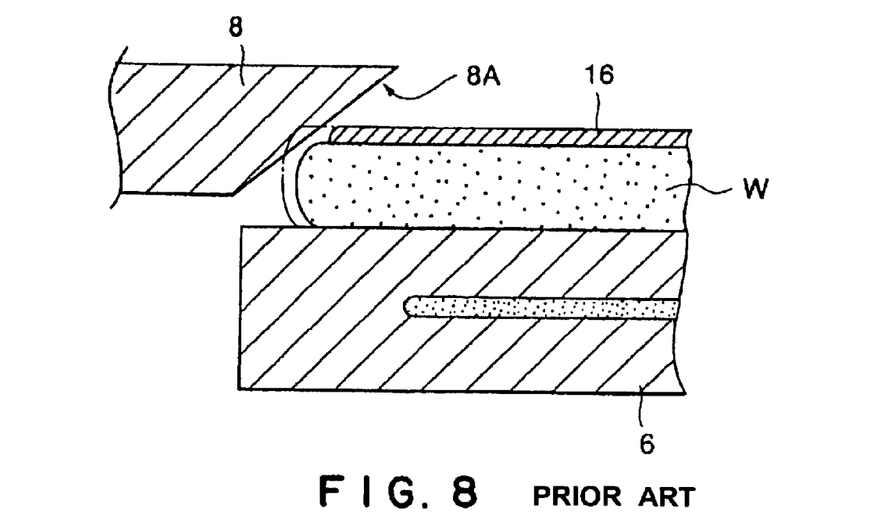
FIG. 8 is a partial sectional view of a semiconductor wafer showing an ideal film-forming state.

FIG. 8 shows a partial sectional view of a semiconductor wafer in a condition wherein a film is formed ideally. In the condition shown in FIG. 8, a metallic film such as a tungsten film is deposited only on a surface (an upper surface in the drawing) of the wafer W, not on a lateral or reverse surface thereof.

Herein, the taper surface 8A of the clamping ring 8 comes in contact with the circumferencial edge of the wafer W in a linear contact manner. Thus, the contact state often may not become even i.e. may be uneven. The film-forming gas may flow into the reverse-side space S1 through a slight gap that is formed at the contact portion, so that an unnecessary film may be deposited on the lateral or reverse surface of the wafer W and on the stage 6. In addition, an unnecessary film may be stuck on an inner surface of the processing container 2 or on a surface of the showerhead 12. As described above, in the metal CVD method, it is difficult to deposit a film only on an upper surface of a wafer.

In addition, reaction products or by-products may be formed at a high-temperature portion, whose temperature is as high as the reaction temperature at a periphery of the stage 6, and on a wall surface of the processing container 2. On the contrary, at a low-temperature portion, a problem in which a non-reacted source gas condenses may be generated. Thus, in a conventional CVD method for W, WSi, TiN, Ti or the like, these unnecessary films and residual substances are decomposed and removed by introducing a cleaning gas such as $ClF_3$ gas or $NF_3$, gas, or a plasma into the processing container 2 every a predetermined number of wafers or every wafer. That is, an in-situ cleaning operation is carried out in general.

As described above, there are effective cleaning gases for removing unnecessary films of W, WSi, TiN, Ti or the like.

In the respect that a circuit element of a low resistance can be formed, aluminum and copper are superior. However, development for the method of filling a contact-hole or a groove for a circuit by means of CVD methods using organic aluminum or copper compound has just started. Thus, no effective cleaning gas has been found for aluminum films or copper films, yet.

That is, if a CVD process for copper is carried out by using an organic copper compound as a source material, there is a problem in which there is no etching gas that can etch residual substances of the copper compound within a sufficient short time, because the copper compound has only a low vapor pressure in general.

If a CVD process for aluminum is carried out by using an organic aluminum compound as a source material, there is a problem in which surfaces of the processing container, the showerhead and so on may greatly corrode if a cleaning gas for cleaning residual substances including aluminum is introduced, because the material of the processing container for the metal CVD method is aluminum in general.

SUMMARY OF THE INVENTION

This invention is intended to solve the above problems. The object of this invention is to provide a processing unit that can prevent a film-forming gas from flowing into a reverse side of a stage.

The invention is a film-forming unit comprising: a processing container in which a vacuum can be created; a stage arranged in the processing container, on which an object to be processed is placed; a process-gas supplying means for supplying a process gas into the processing container; a heating means for heating the object to be processed placed on the stage; a division wall that surrounds a lateral side and a lower side of the stage; an inert-gas supplying means for introducing an inert gas into a stage-side region surrounded by the division wall; and a gap-forming member whose inner peripheral portion is arranged above a peripheral portion of the object to be processed placed on the stage via a gap and whose outer peripheral portion is arranged above the division wall via a gap.

By supplying the inert gas into the stage-side region by means of the inert-gas supplying means, the inert gas can flow into the processing-space side through the inner-peripheral-side and outer-peripheral-side gaps that are formed by the gap-forming member.

Thus, it is prevented that the film-forming gas may reach the lateral side or the reverse side of the object to be processed. Thus, it is prevented that unnecessary films may be deposited on the lateral surface and the reverse surface thereof and on the surface of the stage.

Preferably, a contact portion for pressing and fixing the peripheral portion of the object to be processed is provided at a lower surface of the inner peripheral portion of the gap-forming member.

Preferably, the gap-forming member is vertically movable.

Preferably, a plurality of contact portions is provided at a predetermined height. In the case, even if the thickness of the object to be processed is variable because of a manufacturing tolerance or the like, the inert gas can be caused to flow into the processing-space side at a stable flow amount or flow speed.

Preferably, a height of the gap defined by the division wall and the outer peripheral portion of the gap-forming member is larger than a height of the gap defined by the peripheral portion of the object to be processed and the inner peripheral portion of the gap-forming member. For example, the height of the gap defined by the division wall and the outer peripheral portion of the gap-forming member may be about ten times as large as the height of the gap defined by the peripheral portion of the object to be processed and the inner peripheral portion of the gap-forming member.

In the case, even if a pressure change may happen in the supplied inert gas or the like, the pressure change may be easily absorbed, and the inert gas can be caused to flow always at stable flow amount and flow speed through the inner-peripheral-side gap.

Preferably, a temperature controlling means for setting a temperature of the processing container to be higher than a condensation temperature of the process gas and lower than a decomposition temperature and a reaction temperature of the process gas is provided for the processing container.

Preferably, a temperature controlling means for setting a temperature of the process-gas supplying means to be higher than a condensation temperature of the process gas and lower than a decomposition temperature and a reaction temperature of the process gas is provided for the process-gas supplying means.

Preferably, an electrostatic chuck is provided in the stage in order to fix the object to be processed placed on the stage.

Preferably, the gap-forming member is provided with a heater. In the case, the gap-forming member may be provided with a thermocouple.

DESCRIPTION OF THE PREFERRED EMBODIMENT

An embodiment of a film-forming unit according to the invention is explained in detail based on attached drawings.

Figure 1:
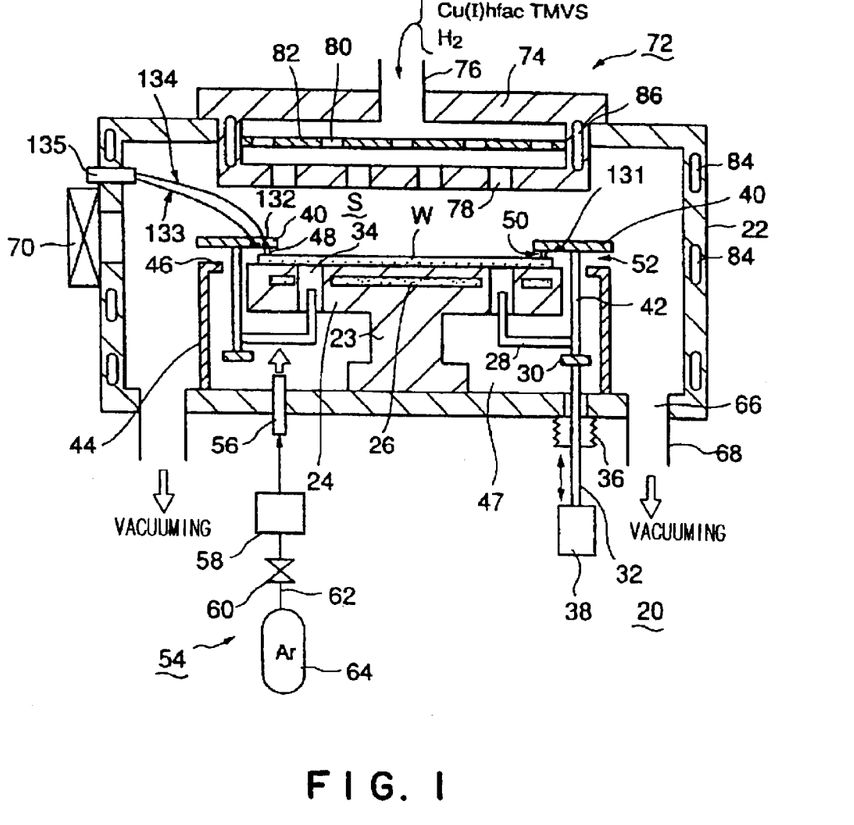
FIG. 1 is a structural view showing an embodiment of a film-forming unit according to the invention.
Figure 2:
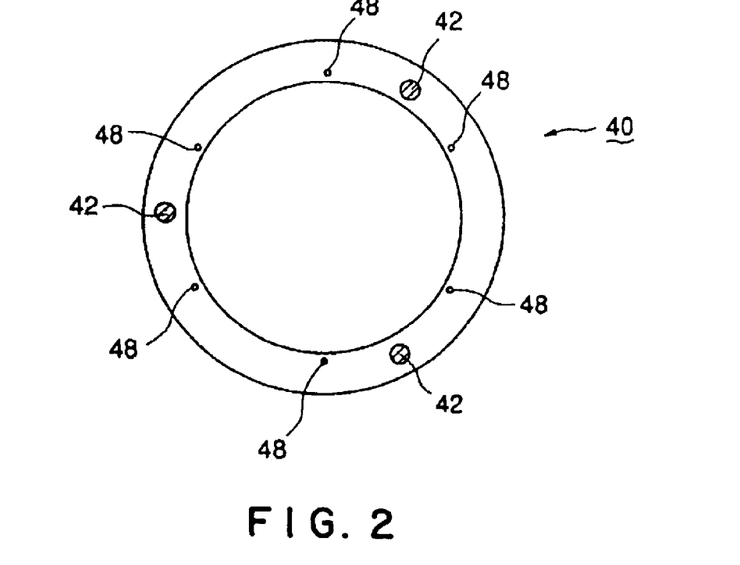
FIG. 2 is a plan view showing a reverse surface of a clamping-ring member.
Figure 3:
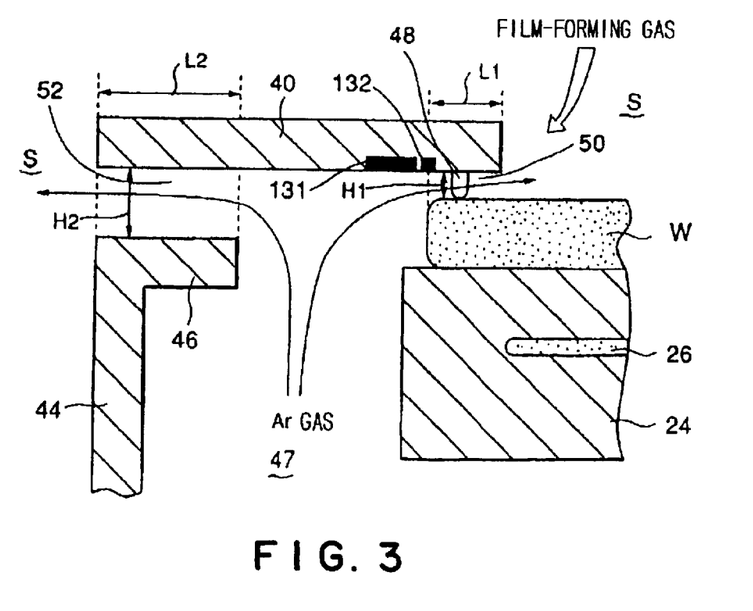
FIG. 3 is a partial enlarged view of a main part of the film-forming unit shown in FIG. 1.

FIG. 1 is a structural view showing a film-forming unit according to the invention. FIG. 2 is a plan view showing a reverse surface of a clamping-ring member. FIG. 3 is a partial enlarged view of a main part of the film-forming unit shown in FIG. 1.

The film-forming unit 20 has a processing container 22 that is made of for example aluminum and that is formed into a cylindrical shape or a box-like shape. A stage 24 for placing a semiconductor wafer W as an object to be processed thereon is provided in the processing container 22. The stage 24 is made of for example a carbon material or any aluminum compound such as AlN or the like. The stage 24 is supported by a column 23 that stands up at a base portion of the processing container. A resistance heater 26 as a heating means is buried in the stage 24.

A circular supporting member 30, which is caused to move vertically by a pushing rod 32 that goes through a base portion of the processing container, is arranged below the stage 24. A plurality of, for example three L-shaped lifter pins 28 (only two are shown in the drawing) are provided in such a manner that they stand up inward with respect to the circular supporting member 30. The lifter pins 28 are adapted to go through lifter-pin holes 34, which are formed through the stage 24, in order to lift up the wafer W when the supporting member 30 moves up.

A lower end of the pushing rod 32 is connected to an actuator 38 via a bellows 36, which can expand and retract in order to keep an airtight state in the processing container 22. A clamping ring member 40, which has for example a substantially ring shape along a contour of the wafer, is provided at a peripheral portion of the stage 24 in order to press and fix the periphery of the wafer to the stage 24. The clamping ring member 40 may be made of for example ceramics such as AlN. The clamping ring member 40 is connected to the ring supporting-member 30 via a connecting rod 42. Thus, the clamping ring member 40 is adapted to move vertically together with the lifter pins 28. Herein, the lifter pins 28, the connecting rod 42 and so on are made of aluminum or the like.

A cylindrical division wall 44 that stands up at a base portion of the processing container is arranged near an outer periphery of the stage 24. An upper end of the division wall 44 bends to a horizontal direction in a L-shaped manner, in order to form a bending portion 46. The division wall 44 is made of for example aluminum. By arranging such a division wall 44, an inert-gas purging room 47 is formed on an outer-periphery side and a reverse-surface side of the stage 24. A horizontal level of the bending portion 46 is substantially the same as the upper surface of the stage 24. In addition, an inside end of the bending portion 46 is away from the outer periphery of the stage 24 by a slight distance. The connecting rod 42 is inserted through the gap between them.

As shown in FIGS. 2 and 3, a plurality of (six in the shown example) contact-protrusions 48 are formed on an under surface of the clamping ring member 40 at an inner-periphery portion, in a circumferencial direction thereof at substantially the same intervals. In a clamping state, the lower end surfaces of the plurality of contact-protrusions 48 are adapted to come in contact with the upper surface of a peripheral portion of the wafer W and press down the same. In the case, the diameter of a contact-protrusion 48 is about 1 mm, and the height H1 thereof is about 50 $\mu$m. Thus, in the clamping state, a circular gap having the height H1 is formed as a first gas-purging gap 50. In addition, an overlapped width L1 by the peripheral portion of the wafer W and the inner-peripheral side of the clamping ring member 40 (a flow channel length of the first gas-purging gap 50) is about several mm.

A circular heater member 131 is buried in a lower surface of the clamping ring member 40 in a circumferencial direction of the clamping ring member 40 at a portion near the contact-protrusions 48. A or more thermocouples 132 for a control are provided between the contact-protrusions 48 and the heater element 131. Cables 133 and 134 are connected to the heater element 131 and the thermocouples 132 for a control, respectively. The cables 133 and 134 may extend to an outside of the container via a cable port 135 that is provided at a side wall of the container.

The peripheral portion of the clamping ring member 40 is located above the bending portion 46 of the division wall 44. A gap between the clamping ring member 40 and the bending portion 46 forms a circular second gas-purging gap 52. In the case, the height H2 of the second gas-purging gap 52 is set at about 500 $\mu$m, which is about ten times as great as the height H1 of the first gas-purging gap 50. An overlapped width L2 by the peripheral portion of the clamping ring member 40 and the bending portion 46 (a flow channel length of the second gas-purging gap 52) is set at for example about 10 mm. Thus, the inert gas in the inert-gas purging room 47 is adapted to flow out to a side of the processing space S through both of the gaps 50 and 52.

With reference to FIG. 1, a gas nozzle 56 that forms a part of an inert-gas supplying means 54 is provided at a base portion of the processing container. The gas nozzle 56 is connected to a gas flow channel 62, which is provided with a flow-rate controller 58 such as a mass-flow controller and a switch (open/shut) valve 60 on the way. The other end of the gas flow channel 62 is connected to an Ar gas source 64 that stores Ar gas as an example of inert gas. The inert gas may be He gas instead of the Ar gas.

Discharging ports 66 are provided at a peripheral base portion of the processing container. The discharging ports 66 are connected to discharging ducts 68, which are connected to a vacuum pump not shown. Thus, the inside of the processing container 22 may be maintained at a predetermined vacuum level. A gate valve 70 that is caused to open and close when the wafer is conveyed in and out is arranged at a side wall of the processing container 22.

A showerhead 72 as a process-gas supplying means that introduces a film-forming gas or the like into the processing container 22 is provided at a ceiling part of the processing container facing the stage 24. To be more concrete, the showerhead 72 has a head body 74 that is made of for example aluminum and that is shaped into a cylindrical box. A gas-introducing port 76 is provided at a ceiling part of the head body 74.

The gas-introducing port 76 is connected to a or more gas sources of a or more gases necessary for the process, for example a copper complex gas (Cu(I) hfac TMVS: Trimethyl vinylsilyl hexafluoroacetylacetonato copper I) and a carrier gas such as $H_2$ gas, via a or more gas channels, in such a manner that the flow rates of the gases can be controlled.

Many gas-jetting holes 78 for jetting out the gas or gases supplied into the head body 74 to the processing space S are formed at a lower portion of the head body 74 and arranged in substantially the whole surface thereof. Thus, the gas or gases are adapted to be jetted out to the whole surface of the wafer.

As the occasion demands, a diffusion plate 82 having many gas-diffusing holes 80 may be arranged in the head body 74. Thus, the gas or gases are adapted to be supplied to the surface of the wafer more uniformly.

Heating medium flow channels 84 and 86 are formed in the side wall of the processing container 22 and in the side wall of the showerhead 72, respectively, as temperature adjusting means. As a heating medium, for example, hot water of a predetermined temperature may be caused to flow therethrough.

Next, a film-forming process that is carried out by using the above film-forming unit is explained.

At first, the gate valve 70 provided at the side wall of the processing container 22 is opened, and the wafer W is conveyed into the processing container 22 by a conveying arm not shown. Then, the lifter pins 28 are caused to move up and receive the wafer.

Next, the pushing rod 32 is caused to move down, and hence the lifter pins 28 move down, so that the wafer W is placed on the stage 24. Then, the pushing rod 32 is caused to move down furthermore, so that the peripheral portion of the wafer W is pressed and fixed because of a weight of the clamping ring member 40.

Then, the Ar gas is introduced into the inert-gas purging room 47 at a predetermined flow rate, through the gas nozzle 56 of the inert-gas supplying means 54 arranged below the stage 24. On the other hand, the wafer W is heated to and maintained at a predetermined process temperature by means of the resistance heater 26 buried in the stage 24.

Next, a complex gas including Cu as a film-forming gas is supplied into the showerhead 72 together with $H_2$ gas as a carrier gas, at respective predetermined flow rates, from process-gas sources not shown. The complex gas and the $H_2$ gas are supplied from the gas-jetting holes 78 at the under surface of the head body 74 into the processing space S of the processing container 22 substantially uniformly. At the same time, the inside atmosphere is discharged from the discharging ports 66 in order to set the inside of the processing container 22 at a predetermined pressure. Then, the film-forming gas supplied into the processing space S generates a predetermined chemical reaction, so that a copper film is deposited on the surface of the wafer.

At the depositing step, the pressure of the Ar gas, which is an inert gas supplied into the inert-gas purging room 47 below the stage 24, is slightly higher than the pressure of the film-forming gas in the processing space S. Thus, as shown in FIG. 3, the Ar gas flows out up to the processing space S little by little through the first gas purging gap 50 having the height H1=about 50 μm and through the second gas purging gap 52 having the height H2=about 500 μm. Thus, the film-forming gas may not flow into the inert-gas purging room 47 through the first gas purging gap 50. Thus, it can be prevented that unnecessary copper films are deposited on the lateral surface and the reverse surface of the wafer W. In addition, for the same reason, it can be prevented that unnecessary copper films are deposited on the surface of the stage 24.

Herein, the important point is that deposition of copper films onto a regular portion on the upper surface of the wafer may be disturbed if the amount of the Ar gas flowing up into the processing space S through the first gas purging gap 50 is so much that flow of the film-forming gas to reach the surface of the wafer W is disturbed. Thus, it is necessary to properly control the amount of the Ar gas flowing out upward. The control of the amount of the flowing-out Ar gas can be achieved by controlling a supply amount of the Ar gas and/or a pressure in the inert-gas purging room 47. In addition, it can be achieved by changing the height H1 and/or the flow channel length [000c]L1 of the first gas purging gap 50 or the height H2 and/or the flow channel length L2 of the second gas purging gap 52 or the like.

Especially, although the thickness of the wafer W may change to a certain extent because of some manufacturing tolerance, the contact-protrusions 48 of a uniform height come to contact with the surface of the wafer, in this embodiment. Thus, the height H1 of the first gas purging gap 50 may be always precisely maintained at a fixed value (herein, 50 μm) according to a designed value. Thus, the amount of the Ar gas flowing through the gap may be maintained at a fixed value without changing.

Even if the pressure of the Ar gas supplied into the inert-gas purging room 47 changes or the like because of some disturbance, the change of the pressure of the Ar gas may be absorbed by a change of the amount of the Ar gas flowing out through the second gas purging gap 52, since the height H2 of the second gas purging gap 52 is set to be much greater than (for example about ten times as great as) the height H1 of the first gas purging gap 50. Thus, it is possible to make the Ar gas flow out through the first gas purging gap 50, always at stable flow amount and flow speed.

Herein, the necessity of the second gas purging gap 52 is explained more detail.

In the first gas purging gap 50, in order to prevent the film-forming gas from flowing down into the inert-gas purging room 47, it is necessary that [a flow speed of the Ar gas V1× the flow channel length L1] is greater than a diffusion constant of the film-forming gas. However, it is very difficult to structurally control a conductance C1 of the flow channel length L1 of the first gas purging gap 50. For example, the conductance C1 changes considerably depending one each processing container, because of unevenness of dimensions within manufacturing tolerance and assembly tolerance.

If the second gas purging gap 52 is not provided, as the conductance C1 changes, the flow amount Q1 of the Ar purge gas flowing out from the first gas purging gap 50 also changes. Thus, the flow speed V1= (the flow amount Q1)/(an area of the cross section for gas-jetting) also changes. However, if the second gas purging gap 52 is provided, the flow amount of the Ar purge gas can be divided into for the first gas purging gap 50 (Q1) and for the second gas purging gap 52 (Q2). Then, since the height H2 and the flow channel length L2 of the gap 52 are greater than the height H1 and the flow channel length L1 of the gap 50, the flow amount Q1 flowing through the first gas purging gap 50 may be about two-digit smaller than the flow amount Q2 flowing through the second gas purging gap 52. In the above flow-amount relationship, even if the conductance C1 changes to some extent, it can be prevented that the flow amount Q1 changes greatly. Thus, stabilization of the flow speed V1 can be achieved.

Another reason why the second gas purging gap 52 is necessary is that it can dilute and discharge the film-forming gas if a small amount of the film-forming gas flows into the purging room 47.

As described above, regarding the first gas purging gap 50, the flow channel length L1 must be small because of a demand for reducing the non-deposited part of the end portion of the wafer surface. On the other hand, since (the flow speed)=(the flow amount)/(the area of the cross section for gas-jetting), if the flow amount Q1 is too much, the deposition may be badly influenced. Thus, there is a restriction to keep the flow amount Q1 to the minimum necessary. That is, regarding the first gas purging gap 50, the measure of increasing (the flow speed)×(the flow channel length) is limited to reducing the area of the cross section for gas-jetting by reducing the height H1.

On the other hand, regarding the second gas purging gap 52, there is no restriction about the flow channel length L2. With respect to the flow amount Q2 as well, in order to make the flow amount Q1 through the first gas purging gap 50 smaller, the greater part of the Ar purge gas flows through the second gas purging gap 52. That is, the flow amount Q2 is much enough. However, the heights H1, H2 and the flow channel lengths L1, L2 of the first gas purging gap 50 and the second gas purging gap 52 may affect the flow amounts Q1, Q2 mutually via the conductance C1, C2. Thus, the height and the flow channel length of the second gas purging gap 52 should be determined in such a manner that the flow amounts Q1 and Q2 are properly assigned.

Figure 4:
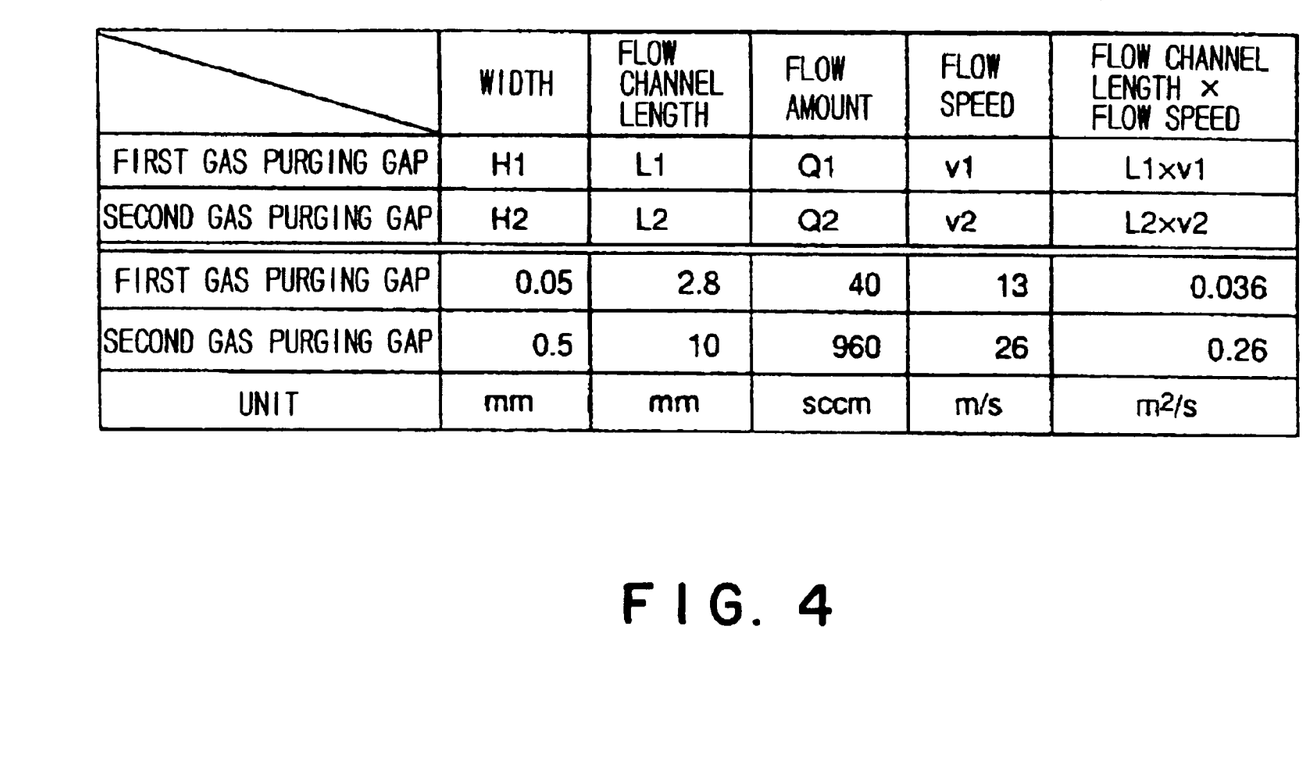
FIG. 4 is a view showing dimensions of the main part of the film-forming unit shown in FIG. 1 and conditions such as gas flow rates.

Herein, as an example, a condition shown in FIG. 4 was set. Then, no copper film was deposited onto the lateral surface and the reverse surface of the wafer, that is, a good result was obtained. At that time, the inside diameter of the processing container 22 was about 300 mm (for corresponding to an 8-inch wafer). Regarding the process condition, the process temperature was 200° C., the process pressure was 1 Torr, the film-forming gas (Cu complex gas) was 0.2 sccm, the $H_2$ gas was 500 sccm, the Ar gas was 500 sccm, and the Ar pressure was 2 kgf (at the outlet of the gas bottle).

In addition, in the embodiment, the heating medium may be caused to flow through the respective heating medium flow channels 84 and 86, which are provided in the side wall of the processing container 22 and in the side wall of the showerhead 72, respectively. Thus, temperatures of the respective wall surfaces may be maintained at respective temperatures that are higher than a condensation temperature of the film-forming gas and that are lower than a decomposition temperature or a reacting temperature of the film-forming gas. If the film-forming gas is for example Cu(I)hfacTMVS, since the condensation-starting temperature is about 40° C. and the decomposition-starting temperature is about 65° C., the temperatures of the respective wall surfaces are maintained at an intermediate temperature between them, for example at about 60° C. Thus, it can be prevented that the film-forming gas condenses and sticks onto the wall surfaces. In addition, it can be prevented that the film-forming gas decomposes or reacts so that copper films stick onto the wall surfaces.

In addition, in order to examine the effect of the contact-protrusions 48 provided at the clamping ring member 40, the height level of the clamping ring member 40 with respect to the stage 24 was set to be always precisely uniform at the deposition step without providing the contact protrusions 48, and a deposition process was conducted to a plurality of wafers. There is an error of thickness caused by a slice error or the like between the plurality of wafers. Thus, the height H1 of the first gas purging gap 50 differs slightly from each wafer. Thus, for example, if a wafer has a thickness slightly thinner than a standard thickness, the height H1 becomes a little greater. Thus, the flow amount of the Ar purge gas that flew out toward the processing space S through the gap 50 became larger, which badly affected the deposition onto the wafer surface. On the contrary, if a wafer has a thickness slightly thicker than the standard thickness, the height H1 becomes a little smaller. Thus, the flow amount of the flowing-out Ar purge gas became smaller, the film-forming gas flew downward, and unnecessary films was deposited on the lateral surface and the reverse surface of the wafer.

In addition, by using the unit explained with reference to FIG. 1 and by maintaining the temperatures of the inside wall surfaces of the showerhead 72 and the processing container 22 at 150° C., which is higher than the thermal decomposition temperature (about 65° C.) of Cu(I) hfacTMVS as a source gas, a deposition process of a Cu film was conducted. Thus, adhesive substances, which are thought to be decomposition products of the film-forming gas, were found on the inside wall surface of the showerhead 72 and the inside wall surface of the processing container 22.

On the contrary, by maintaining the temperatures of the inside wall surfaces of the showerhead 72 and the processing container 22 at 20° C., which is lower than the condensation temperature (about 40° C.) of the above film-forming gas, a deposition process of a Cu film was conducted. Thus, adhesive substances, which are thought to be condensation products of the film-forming gas, were found.

In the above deposition processes wherein these adhesive substances were found, an increase of particles on the wafer W and a change (unevenness) of film-thickness between the wafers were also generated. That is, it is preferable to adjust the temperatures of the inside wall surfaces of the showerhead 72 and the processing container 22.

Figure 5:
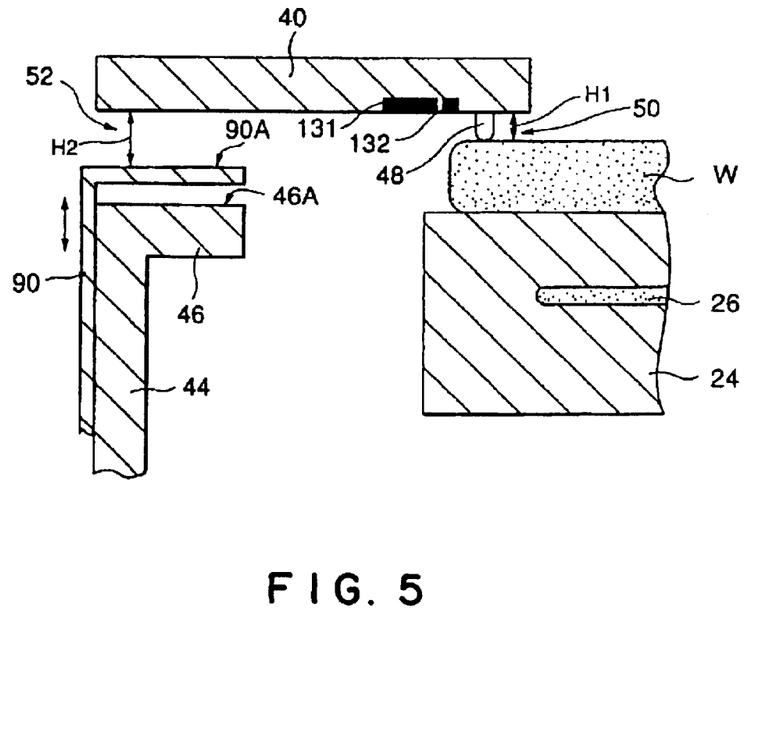
FIG. 5 is a partial enlarged view showing a part of another embodiment of a film-forming unit according to the invention.

In addition, in the above embodiment, the height H2 of the second gas purging gap 52 is fixed to the constant value. However, as shown in FIG. 5, a circular assistant member 90 having a L-shaped section may be slidably provided on the bending portion 46 of the upper end of the division wall 44. In the case, by adjusting a vertical position of the assistant member 90 for example according to a process condition, the height H2 of the second gas purging gap 52 may be adjusted to an optimal value. In addition, it is preferable that the length of an upper surface 90A of the assistant member 90 is set to be substantially the same as the length of an upper surface 46A of the bending portion 46.

In addition, when the lower end surfaces of the six contact-protrusions 48 come in contact with the upper surface of the peripheral portion of the wafer W, it is possible that heat escapes from the wafer W to the clamping ring member 40 via the contact-protrusions 48 (heat-discharge). This may deteriorate the uniformity of wafer temperature within the surface. In the embodiment, by using the thermocouples 132 for a control provided at the clamping ring member 40, the temperatures of positions where they are arranged are monitored, a power supplied to the heater member 131 is controlled, and the temperature of the clamping ring member 40 is controlled to be substantially the same as the wafer temperature. Thus, the heat-discharge from the wafer may be prevented, so that the uniformity of wafer temperature within the surface may be maintained at a high level.

In addition, if the number of contact-protrusions 48 is increased or if a material good in heat conductivity such as AlN is used as a material for the contact-protrusions 48, the temperature of the clamping ring member 40 can become substantially the same as the wafer W within a shorter time after the clamping ring member 40 and the wafer W come in contact with each other.

In addition, on the contrary, if the number of contact-protrusions 48 is decreased or if a heat-insulating material such as quartz or Teflon is used as a material for the contact-protrusions 48, the amount of discharged heat may be reduced when the clamping ring member 40 and the wafer W come in contact with each other.

Anyway, it is preferable that the clamping ring member 40 is as thin as possible and has as a small thermal capacity as possible, in order to restrain the thermal effect to the wafer W.

In addition, an electrostatic chuck may be provided on the upper surface of the stage 24 in order to help the clamping force by the clamping ring member 40. Thus, in particular when the number of contact-protrusions 48 is small so that the clamping force is low, the clamping (holding) force may be compensated. In addition, in the case, the contact tightness between the stage 24 and the wafer W is enhanced, and the heat conductivity between them is also enhanced, so that the time for heating the wafer to a predetermined temperature may be shortened. That is, the temperature of the clamping ring member 40 and the temperature of the wafer W can be made substantially the same within a shorter time.

Figure 6:
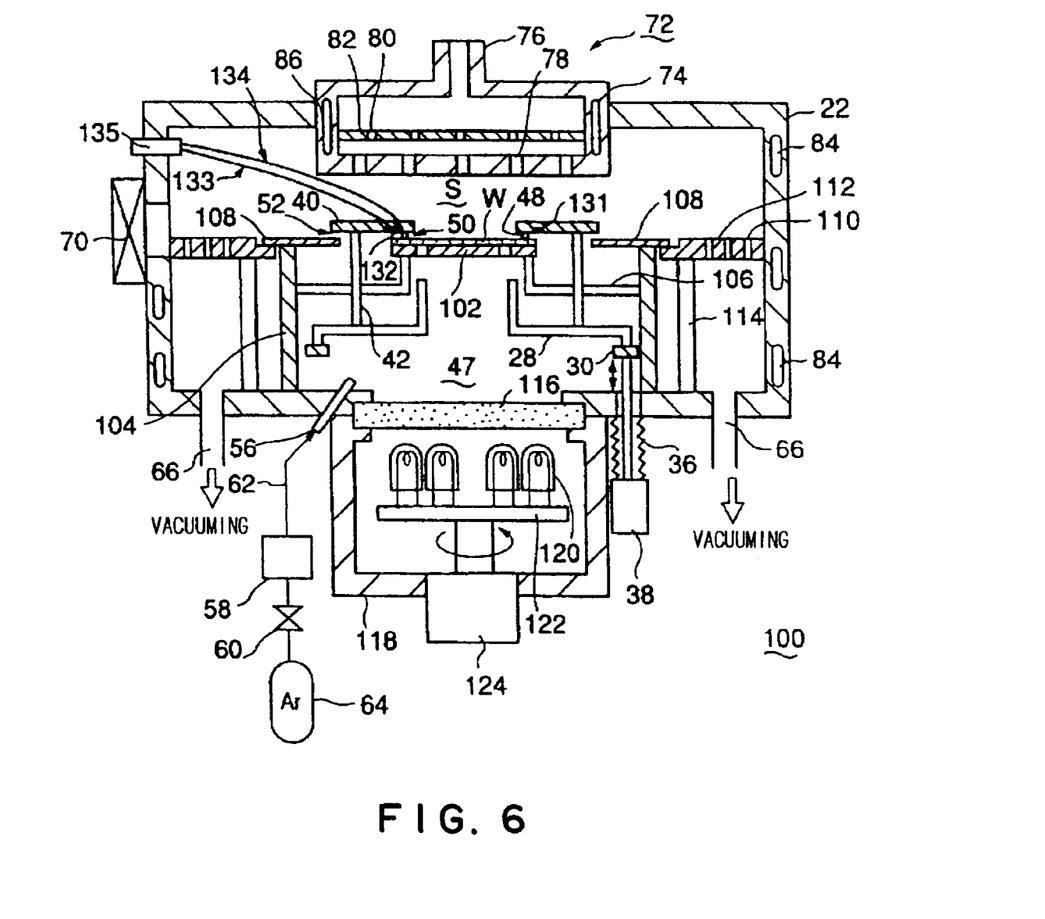
FIG. 6 is a structural view of a lamp-heating type of film-forming unit according to the invention.

In the embodiment, the resistance heater is used as a heating means for the wafer. However, the heating means is not limited thereto. For example, this invention is also applicable to a film-forming unit that uses a heating lamp as the heating means. FIG. 6 is a schematic view showing a case wherein this invention is applied to a lamp-heating type of film-forming unit. Herein, the same reference signs are used for the same parts as shown in FIG. 1, and the explanation is omitted.

In a film-forming unit 100, a stage 102 is a plate member having a thickness of about 1 mm. It is made of a carbon material or an aluminum compound such as AlN. The stage 102 is supported by three supporting arms 106 (only two of them are shown in the drawing) which extend from an upper inside wall of a cylindrical reflector 104 that stands up from a base portion of the processing container 22. The reflector 104 is made of for example aluminum.

A circular attachment 108 made of for example aluminum is provided on an upper end of the reflector 104. The reflector 104 and the attachment 108 form a division wall defining the inert-gas purging room 47 therein. A gap between an upper surface of the attachment 108 at an inner peripheral portion thereof and a lower surface of the clamping ring member 40 at an outer peripheral portion thereof forms the second gas purging gap 52.

A circular straightening plate 112 having many straightening holes 1 is supported by a supporting column 114 standing up from a base portion of the container in such a manner that the plate 112 is in contact with an outer peripheral portion of the attachment 108. A penetrable window 116 made of a heat-ray penetrable material such as quartz is hermetically provided at a base portion of the processing container, directly below the stage 102. A box-like heating room 118 is formed below the penetrable window 116. A plurality of heating lamps 1as a heating means are mounted on a rotatable stage 122 serving also as a reflector mirror, in the heating room 118. The rotatable stage 122 is rotated via a rotational shaft by a rotational motor 124 provided at a base portion of the heating room 118. The heat-ray emitted from the heating lamps 1is adapted to penetrate through the penetrable window 116 and reach and heat the lower surface of the stage 102.

In the film-forming unit 100, Ar gas is introduced from the gas nozzle 56 into the inert-gas purging room 47 below the stage 102. The Ar gas flows out to the processing space S through the first gas purging gap 50 on the inner-peripheral side of the clamping ring member 40 and the second gas purging gap 52 on the outer-peripheral side thereof. Thus, it can be prevented that unnecessary films stick to the lateral surface or the reverse surface or the like of the wafer W. That is, the same effect as the firm-forming unit shown in FIG. 1 can be achieved.

In the film-forming unit 100, a mechanism for controlling the temperature of the clamping ring member 40 to become substantially the same as the temperature of the wafer is the same as in the unit shown in FIG. 1. That is, a or more thermocouples for a control 132 and a or more heater members 131 are provided in the clamping ring member 40. However, the mechanism for controlling the temperature is not limited thereto. For example, a mechanism, wherein the reverse surface of the clamping ring member 40 is colored and angles of the heating lamps 1in the heating room 118 are adjusted so that the temperature of the clamping ring member 40 is raised by absorbing light from the lamps, may be used.

In the above embodiments, the copper film is formed as a metal film. However, the metal film is not limited thereto. This invention is also applicable to a case wherein an aluminum film is formed. In addition, herein, the Ar gas is used as an inert gas for purging. However, instead of the Ar gas, any other inert gas such as He gas may be used.

An object to be processed is not limited to the semiconductor wafer this invention is of course applicable to an LCD substrate or a glass substrate.

What is claimed is:

1. A film-forming unit comprising;
    a processing container in which a vacuum can be created,
    a stage arranged in the processing container, on which an object to be processed is placed,
    a process-gas supplying means for supplying a process gas into the processing container,
    a heating means for heating the object to be processed placed on the stage,
    a division wall that surrounds a lateral side and a lower side of the stage,
    an inert-gas supplying means for introducing an inert gas into a stage-side region surrounded by the division wall, and
    a gap-forming member whose inner peripheral portion is arranged above a peripheral portion of the object to be processed placed on the stage via a first gap and whose outer peripheral portion is arranged above and overlapping the division wall via a second gap.

2. A film-forming unit according to claim 1, wherein:
    a contact portion for pressing and fixing the peripheral portion of the object to be processed is provided at a lower surface of the inner peripheral portion of the gap-forming member.

3. A film-forming unit according to claim 2, wherein:
    the gap-forming member is vertically movable.

4. A film-forming unit according to claim 2, wherein:
    a plurality of contact portions are provided at a predetermined height.

5. A film-forming unit according to any of claims 1 to 4, wherein:
    a height of the second gap defined by the division wall and the outer peripheral portion of the gap-forming member is larger than a height of the first gap defined by the peripheral portion of the object to be processed and the inner peripheral portion of the gap-forming member.

6. A film-forming unit according to claim 5, wherein:
    the height of the second gap defined by the division wall and the outer peripheral portion of the gap-forming member is about ten times as large as the height of the first gap defined by the peripheral portion of the object to be processed and the inner peripheral portion of the gap-forming member.

7. A film-forming unit according to any of claims 1 to 4, wherein:
    a temperature controlling means for setting a temperature of the processing container to be higher than a condensation temperature of the process gas and lower than a decomposition temperature and a reaction temperature of the process gas is provided for the processing container.

8. A film-forming unit according to any of claims 1 to 4, wherein:
    a temperature controlling means for setting a temperature of the process-gas supplying means to be higher than a condensation temperature of the process gas and lower than a decomposition temperature and a reaction temperature of the process gas is provided for the process-gas supplying means.

9. A film-forming unit according to any of claims 1 to 4, wherein:
    an electrostatic chuck is provided in the stage in order to fix the object to be processed placed on the stage.

10. A film-forming unit according to any of claims 1 to 4, wherein:
    the gap-forming member is provided with a heater.

11. A film-forming unit according to claim 10, wherein:
    the gap-forming member is provided with a thermocouple.

12. A film-forming unit according to claim 1, wherein
    the first gap between the inner peripheral portion of the gap-forming member and the peripheral portion of the object to be processed placed on the stage has a first height and a length,
    the second gap between the outer peripheral portion of the gap-forming member and the division wall has a second height and a second radial length,
    the second height is greater than the first height, and
    the second radial length is greater than the first radial length.

* * * * *